(12) United States Patent
Lee et al.

(10) Patent No.: US 12,174,595 B2
(45) Date of Patent: Dec. 24, 2024

(54) SCALABLE ANALOG PIM MODULE, METHOD OF CONTROLLING ANALOG PIM, SIGNAL PROCESSING CIRCUIT, AND SENSOR DEVICE

(71) Applicants: SKAIChips Co., Ltd., Suwon-si (KR); Research & Business Foundation SUNGKYUNKWAN UNIVERSITY, Suwon-si (KR)

(72) Inventors: Kang Yoon Lee, Seoul (KR); Jong Wan Jo, Suwon-si (KR); Sung June Byun, Suwon-si (KR); Dae Young Choi, Suwon-si (KR); Young Gun Pu, Suwon-si (KR); Joon Mo Yoo, Guri-si (KR); Yeon Jae Jung, Seoul (KR); Hyung Ki Huh, Seoul (KR); Seok Kee Kim, Seoul (KR)

(73) Assignees: SKAIChips Co., Ltd., Suwon-si (KR); Research &Business Foundation SUNGKYUNKWAN UNIVERSITY, Suwon-si (KR)

( * ) Notice: Subject to any disclaimer, the term of this patent is extended or adjusted under 35 U.S.C. 154(b) by 411 days.

(21) Appl. No.: 17/826,168

(22) Filed: May 27, 2022

(65) Prior Publication Data

US 2023/0185252 A1    Jun. 15, 2023

(30) Foreign Application Priority Data

Dec. 14, 2021   (KR) .................. 10-2021-0178240

(51) Int. Cl.
 *G05B 13/02*   (2006.01)
 *G11C 11/419*  (2006.01)
 (Continued)

(52) U.S. Cl.
 CPC .......... *G05B 13/027* (2013.01); *G11C 11/419* (2013.01); *H03M 1/124* (2013.01);
 (Continued)

(58) Field of Classification Search
 CPC .... G05B 13/027; G11C 11/419; H03M 1/124; H04B 1/10
 See application file for complete search history.

(56) References Cited

U.S. PATENT DOCUMENTS

2018/0075344 A1   3/2018  Ma et al.
2019/0052294 A1*  2/2019  Abdelmonem ..... H04W 52/223
(Continued)

FOREIGN PATENT DOCUMENTS

KR   10-2018-0028966 A   3/2018
KR   10-2020-0066953 A   6/2020
(Continued)

OTHER PUBLICATIONS

Notice of Allowance mailed Apr. 11, 2022 for Korean Application No. 10-2021-0178240.

*Primary Examiner* — Joseph J Lauture
(74) *Attorney, Agent, or Firm* — Insight Law Group, PLLC; Seung Lee (57) ABSTRACT

Provided are a scalable analog passive intermodulation (PIM) module, a method of controlling analog PIM, a signal processing circuit, and a sensor device. The scalable analog PIM module includes a first plural number of digital-to-analog converters (DACs), a first plural number of static random access memory (SRAM) calculators connected to the first plural number of DACs, at least one analog-to-digital converter (ADC) connected to the first plural number of SRAM calculators and configured to convert an analog convolution result signal into digital convolution data, and an analog PIM controller configured to output an enable
(Continued)

control signal for enabling a second number, which is equal to or less than first plural number, of SRAM calculators among the first plural number of SRAM calculators to the first plural number of SRAM calculators on the basis of the convolution data output from the ADC.

19 Claims, 7 Drawing Sheets

(51) Int. Cl.
*H03M 1/12* (2006.01)
*H02M 3/158* (2006.01)
*H02M 7/06* (2006.01)
*H03G 3/30* (2006.01)
*H03M 1/74* (2006.01)

(52) U.S. Cl.
CPC .............. *H02M 3/158* (2013.01); *H02M 7/06* (2013.01); *H03G 3/30* (2013.01); *H03M 1/74* (2013.01)

(56) References Cited

U.S. PATENT DOCUMENTS

2019/0057304 A1 2/2019 Mathuriya et al.
2020/0174749 A1 6/2020 Kang et al.

FOREIGN PATENT DOCUMENTS

| KR | 10-2021-0068034 A | 6/2021 |
| KR | 10-2225149 B1 | 3/2022 |
| WO | 2020/049363 A2 | 3/2020 |

* cited by examiner

Digital Domain $\quad Y_{OUT,k} = \frac{1}{N}\sum W_{k,i} \times XIN_i$

③ADC  ①DAC

Analog Domain $\quad Y_{Y\_AVG,k} = \frac{1}{N}\sum W_{k,i} \times Va_i$

②MAV (c)

SCALABLE ANALOG PIM MODULE, METHOD OF CONTROLLING ANALOG PIM, SIGNAL PROCESSING CIRCUIT, AND SENSOR DEVICE

CROSS-REFERENCE TO RELATED APPLICATION(S)

This application claims priority from Korean Patent Application No. 10-2021-0178240, filed on Dec. 14, 2021, in the Korean Intellectual Property Office, the disclosure of which is incorporated herein by reference in its entirety.

BACKGROUND

1. Field

The following description relates to scalable passive intermodulation (PIM)-based self-powered signal processing circuit that is universally usable in Internet of things (IoT) sensor devices, and more specifically, to a scalable PIM-based self-powered signal processing circuit that is universally usable in IoT sensor devices, applicable to various types of sensors while supplying its own power, capable of high-speed data processing by applying an artificial intelligence technology to data input from a sensor, and capable of dynamically optimizing power consumption according to the input data.

2. Description of Related Art

With the development of electronic communication technology and the like, various Internet of things (IoT) sensor devices are being applied to various fields. IoT sensor devices are installed in various environments and places, such as a smart home, a factory, a public place, a road, etc., and sense various environments. An IoT sensor device includes a sensor, a processor, a communication chipset, etc. therein to sense surroundings and process or transmit the sensing data to the outside thereof through the communication chipset. Since the IoT sensor device including the sensor, the processor, and the communication chipset is operated by supplied power, there are restrictions in installation. When it is difficult to supply power in a wired or wireless manner, it is difficult to install the IoT sensor device, and there is a restriction on installation that the IoT sensor device should have a built-in battery or cell or should be installed at a location close to a power supply so that power supply is possible. Also, when a state of an IoT sensor device can be dynamically determined on the basis of the sensing data of the IoT sensor device, it is possible to reduce power consumption resulting from communication. In particular, when an artificial intelligence technology can be applied to the IoT sensor device, this is very preferable for state determination.

IoT sensor devices sense various data depending on application fields or types, and the amount of data and power consumption required for data processing vary depending on sensing data. It will be very preferable for an artificial intelligence technology to dynamically reduce power consumption according to the type of IoT sensor device without degrading performance.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The following description relates to a scalable analog passive intermodulation (PIM) module, a method of controlling analog PIM, a signal processing circuit, and a sensor device that are free from restrictions on the installation environment, capable of determining the state of a sensor using artificial intelligence technology, and applicable to various types of sensors for universal use.

The following description also relates to a scalable analog PIM module, a method of controlling analog PIM, a signal processing circuit, and a sensor device that are applicable to various types of sensors and capable of efficiently reducing power consumption by dynamically changing the computational structure of an analog PIM module at an optimal resolution according to input data of an employed sensor.

The following description also relates to a scalable analog PIM module, a method of controlling analog PIM, a signal processing circuit, and a sensor device that relieve the bottleneck of an existing high-speed data processing system by applying scalable PIM to the convolutional neural network (CNN) computation of artificial intelligence technology and are capable of selecting and supplying optimal energy according to an external situation and supporting various types of sensors.

Technical objects to be achieved in the present invention are not limited to those described above, and other technical objects what have not been described will be clearly understood by those of ordinary skill in the art from the following descriptions.

In one general aspect, a scalable analog PIM module includes a first plural number of digital-to-analog converters (DACs), a first plural number of static random access memory (SRAM) calculators connected to the first plural number of DACs, among which a second number, which is one or more, of enabled SRAM calculators generate an analog convolution result signal through an analog operation between a weight and input data, at least one analog-to-digital converter (ADC) connected to the first plural number of SRAM calculators and configured to convert the analog convolution result signal into digital convolution data, and an analog PIM controller configured to output an enable control signal for enabling the second number, which is equal to or less than the first plural number, of SRAM calculators among the first plural number of SRAM calculators to the first plural number of SRAM calculators on the basis of the convolution data output from the ADC.

The analog PIM controller may output an enable signal for activating the second number of SRAM calculators among the first plural number of SRAM calculators to the second number of SRAM calculators and output a disable signal for deactivating other SRAM calculators among the first plural number of SRAM calculators to the other SRAM calculators, and the disable signal may stop the analog operation in the other SRAM calculators.

Each of the SRAM calculators may include an SRAM configured to store the weight, a capacitor configured to store the analog input data through the connected DAC, and a skip switch configured to control storage of the analog input data in the capacitor. When a value of the weight stored in the SRAM calculator is a specified first value, the analog PIM controller may output an off-control signal for opening the skip switch of the SRAM calculator to the SRAM calculator to omit the analog operation of the SRAM calculator.

When input data output from a sensor device (SD) ADC of a sensor signal processing part connected to the analog PIM module does not change a set number of times or more, the analog PIM controller may increase an output resolution of the SD ADC and determine the second number of new SRAM calculators to be enabled among the first plural number of SRAM calculators according to the convolution data output from the ADC.

The analog PIM controller may include an ADC output detector configured to detect the convolution data output from the ADC, a comparator configured to compare the convolution data from the ADC output detector with previous convolution data, and an ADC/SRAM enable controller configured to generate the enable control signal for enabling the second number of SRAM calculators determined from among the first plural number of SRAM calculators according to a comparison result of the comparator and output the enable control signal to the first plural number of SRAM calculators.

The ADC output detector may further detect input data output from an SD ADC of a sensor signal processing part connected to the analog PIM module, the comparator may further compare the input data with previous input data, and the ADC/SRAM enable controller may output the enable control signal to the SD ADC to increase an output resolution of the SD ADC according to a comparison result of the input data and redetermine the second number of SRAM calculators to be enabled among the first plural number of SRAM calculators using the convolution data output from the ADC after the enable control signal is output to the SD ADC. The analog PIM controller may further include a memory configured to store the previous input data and previous convolution data.

When the same result signal is consecutively received from the comparator a specified number of times or more, the ADC/SRAM enable controller may output the enable control signal for enabling a second number, which is larger than the currently set second number, of SRAM calculators to the first plural number of SRAM calculators to increase a resolution of the analog operation of the first plural number of SRAM calculators. The analog PIM controller may output the weight and the input data adjusted according to a change of the second number based on the determination to the second number of SRAM calculators.

The analog PIM module may be included in an integrated circuit.

In another general aspect, a method of controlling analog PIM includes generating, by a second number of, which is one or more, enabled SRAM calculators among a first plural number of SRAM calculators, an analog convolution result signal according to an analog operation between a weight and input data, converting the analog convolution result signal into digital convolution data, determining the second number of SRAM calculators to be enabled among the first plural number of SRAM calculators on the basis of the convolution data, and enabling the determined second number of SRAM calculators.

The SRAM calculators may include an SRAM configured to store the weight, a capacitor configured to store the analog input data, and a skip switch configured to control storage of the analog input data in the capacitor. The generating of the convolution result signal may include omitting the analog operation through the skip switch according to an off-control signal received from the second number, which is one or more, of SRAM calculators. The determining of the second number of SRAM calculators to be enabled may include, when the convolution data is the same as previous convolution data a specified number of times or more, increasing the second number to increase a calculation resolution of the first plural number of SRAM calculators.

The method may further include, before the determining of the second number of SRAM calculators to be enabled, increasing an output resolution of digital input data output from a sensor signal processing part when the input data output from the sensor signal processing part does not change a specified number of times or more. The method may further include, after the increasing of the output resolution of the input data, sequentially increasing the second number, which is between a minimum number and the first plural number, of SRAM calculators to be enabled among the first plural number of SRAM calculators and redetermining the second number through a comparison between convolution data output from the increased second number of SRAM calculators and the same second number of pieces of previous convolution data.

In still another general aspect, a signal processing circuit includes a power supply configured to generate power from an external signal, a sensor signal processing part configured to process a sensing signal of a sensor, and a CNN control part configured to control the power supply and the sensor signal processing part according to workload data of the power generated by the power supply and sensing data generated by the sensor signal processing part. The CNN control part includes the scalable analog PIM module of claim 1.

The CNN control part may generate and output a power control signal for controlling the power supply and a gain control signal for controlling gain of the sensor signal processing part from the workload data and the sensing data according to a CNN artificial intelligence technology employing the scalable analog PIM module.

The signal processing circuit may be an integrated circuit.

In yet another general aspect, a sensor device includes the signal processing circuit and a sensor connected to the signal processing circuit and configured to output a sensing signal to the signal processing circuit according to power supplied from the signal processing circuit.

Other features and aspects will be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The above and other objects, features, and advantages will become clear through the following detailed description made with reference to the accompanying drawings such that those of ordinary skill in the art can readily implement the technical spirit of the present invention. In describing the present invention, when it is determined that the detailed description of a related known function or configuration may unnecessarily obscure the subject matter of the present invention, the detailed description will be omitted. Hereinafter, exemplary embodiments of the present invention will be described in detail with reference to the accompanying drawings.

Figure 1:
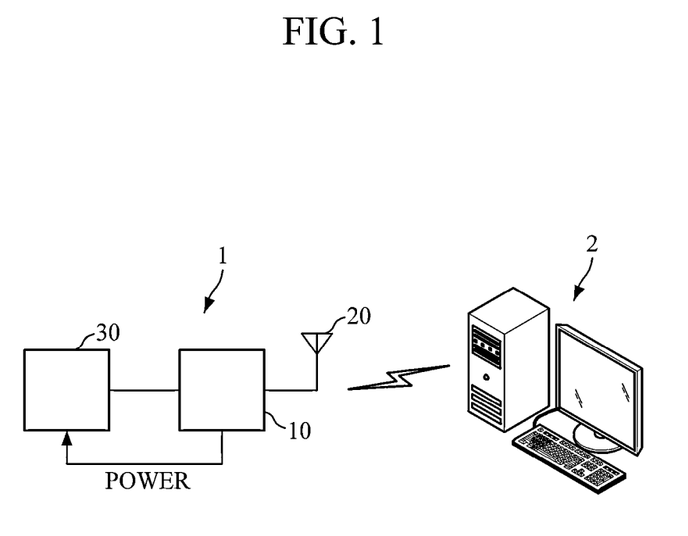
FIG. 1 is a diagram illustrating a monitoring system including a sensor device.

FIG. 1 is a diagram illustrating a monitoring system including a sensor device 1.

The sensor device 1 according to the present invention includes a signal processing circuit 10, a sensor 30, and an energy collection circuit 20. The sensor 30 is a device for sensing an external environment at a location where the sensor device 1 is installed. For example, the sensor device 1 senses the temperature, the humidity, an image, etc. The sensor 30 is connected to the signal processing circuit 10 and operates with power supplied from the signal processing circuit 10 to output a sensing signal to the signal processing circuit 10. The sensor 30 connected to the signal processing circuit 10 may be of various types.

The energy collection circuit 20 collects energy from surroundings of the sensor device 1. The energy collection circuit 20 includes a radio frequency (RF) antenna, a resonant coil, a solar heat cell, and/or an electrostatic collection circuit and thus may collect energy (power) from an RF signal, a resonant signal, solar heat, and/or static electricity, which are available as energy sources.

The signal processing circuit 10 generates and stores power through the energy collection circuit 20 and supplies the generated power to the sensor 30. Also, the signal processing circuit 10 may receive a sensing signal from the sensor 30 and process the sensing signal. For example, the signal processing circuit 10 may determine a state of the sensor 30 or an external state of the sensor device 1 by processing the sensing signal.

The signal processing circuit 10 according to the present invention generates optimal power from various power sources (an RF signal, a resonant signal, solar heat, and/or static electricity) and performs processing of the sensing signal and the like using a convolutional neural network (CNN) algorithm technology. The signal processing circuit 10 includes a scalable analog passive intermodulation (PIM) module 1000 (or analog PIM 1100) for dynamically increasing or reducing a calculation resolution according to the present invention and is configured to perform a convolution operation in the analog domain.

The signal processing circuit 10 including the scalable analog PIM module 1000 (or the analog PIM 1100) may provide variable processing performance required for various types of sensors 30 by adjusting a calculation resolution, thereby achieving optimal power consumption. The signal processing circuit 10 is configured to be applicable to various sensors 30 for universal use. The signal processing circuit 10 includes a self-power generation circuit employing various power sources and thus may be free from environmental restrictions related to an external power source. Preferably, the signal processing circuit 10 is configured as an integrated circuit. The signal processing circuit 10 may be integrated as a semiconductor in a plastic or metal package and mounted on a board of the sensor device 1. The signal processing circuit 10 will be described in detail below with reference to FIG. 2 and the following drawings.

A control terminal 2 of the monitoring system is a terminal for controlling the sensor device 1 (specifically, the signal processing circuit 10). The control terminal 2 which may be a personal computer, a cloud server, or the like updates a weight (a weight of a filter or kernel) of a CNN algorithm processed by the signal processing circuit 10 or sets a parameter for setting accuracy, efficiency, etc. of a CNN algorithm or other processing. The control terminal 2 and the sensor device 1 may be connected in a wired (e.g., Universal Serial Bus (USB) interface or the like) or wireless (e.g., WiFi, ZigBee, etc.) manner such that a setting, a parameter, a weight, etc. of the sensor device 1 may be updated or changed according to control of the control terminal 2.

Figure 2:
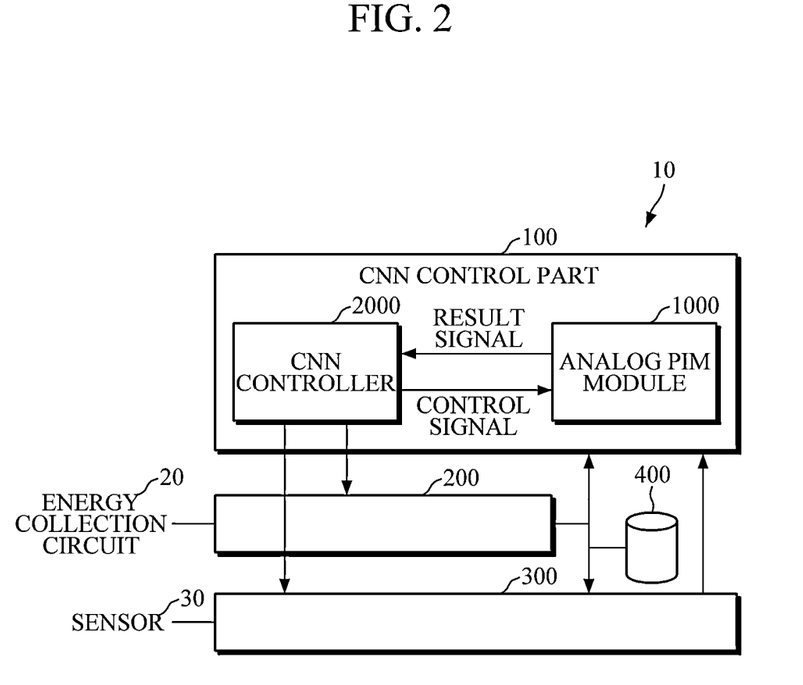
FIG. 2 is a block diagram illustrating an internal configuration of a signal processing circuit.

FIG. 2 is a block diagram illustrating an internal configuration of the signal processing circuit 10.

Referring to FIG. 2, the signal processing circuit 10 includes a CNN control part 100, a power supply 200, a sensor signal processing part 300, and an energy storage 400. In addition to the hardware blocks shown in FIG. 2, the signal processing circuit 10 may include other blocks.

The power supply 200 generates power from a signal from the outside of the sensor device 1. The power supply 200 is connected to the energy collection circuit 20 of the sensor device 1, generates power from an RF signal, a resonant signal, solar heat, and/or an electrostatic signal from the energy collection circuit 20 according to control of the CNN control part 100, and outputs the power. The power supply 200 will be described further with reference to FIG. 3.

The sensor signal processing part 300 processes a sensing signal from the sensor 30. The sensor signal processing part 300 processes a sensing signal from an arbitrary sensor 30 according to control of the CNN control part 100 and outputs processed sensing data.

The energy storage 400 stores power generated by the power supply 200. The energy storage 400 may include a known power storage device for storing power or a capacitor. The power stored in the energy storage 400 (and power currently generated by the power supply 200) is supplied to the other blocks (the CNN control part 100, the sensor signal processing part 300, and the power supply 200).

The CNN control part 100 controls the power supply 200 and the sensor signal processing part 300 according to workload data of the power generated by the power supply 200 and the sensing data generated by the sensor signal processing part 300. The CNN control part 100 includes the CNN controller 2000 and a scalable analog PIM module 1000. The workload data may be data representing the amount of current of generated power.

The analog PIM module 1000 performs a convolution operation between a weight and input data (the workload data and/or sensing data) in the analog signal domain, converts the convolution operation result into digital convolution data, and outputs the digital convolution data. The analog PIM module 1000 operates according to control (a control signal) of the CNN controller 2000 and may variably set a weight size and an input data size to perform a convolution operation.

In other words, the analog PIM module 1000 can reduce power consumption required for an analog operation and also increase the calculation speed by optimizing a calculation size for efficient input data processing. Sensing data, such as a temperature, a humidity, an image, etc., of various sensors 30 may require data resolutions varying depending on the sensors 30. The analog PIM module 1000 according to the present invention is configured to detect a calculation or input resolution that is dynamically efficient according to a data characteristic of the coupled sensor 30 and perform an analog convolution operation at the calculation or input resolution.

The CNN controller 2000 of the CNN control part 100 controls the analog PIM module 1000 to execute a CNN artificial intelligence algorithm for controlling the power supply 200 and/or the sensor signal processing part 300. The CNN controller 2000 may include a microcontroller (MCU) (e.g., a low power MCU), a memory, and circuitry or logic for extracting and classifying characteristics.

When the CNN artificial intelligence algorithm is executed by the scalable analog PIM module 1000, the CNN control part 100 may determine a state of the sensor 30. Also, according to (the technology of) the CNN artificial intelligence algorithm executed by the scalable analog PIM module 1000, the CNN control part 100 generates a power control signal for controlling the power supply 200 and a gain control signal for controlling gain of the sensor signal processing part 300 from the workload data and sensing data and output the power control signal and the gain control signal to the power supply 200 and the sensor signal processing part 300.

According to the CNN artificial intelligence algorithm, the CNN control part 100 may process a layer for the input data and then process subsequent layers to generate a power control signal and a gain control signal on the basis of a classification and determine various states.

Figure 3:
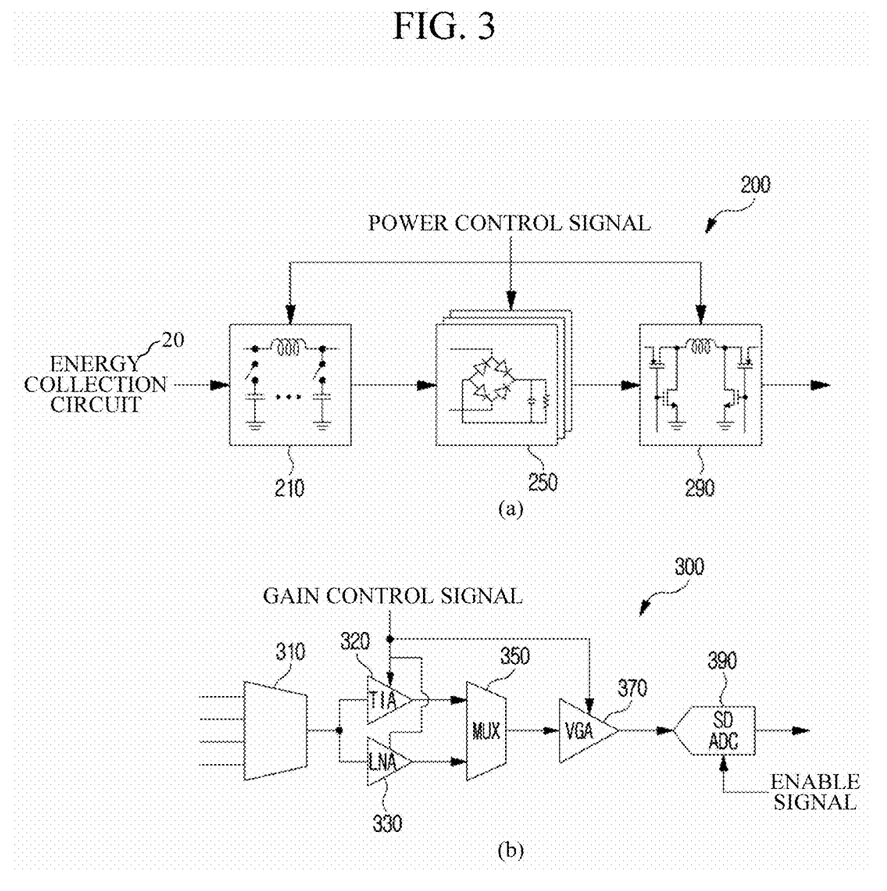
FIG. 3 is a set of block diagrams illustrating a configuration of a power supply and a sensor signal processing part.

FIG. 3 is a set of block diagrams illustrating a configuration of the power supply 200 and the sensor signal processing part 300.

FIG. 3A is an exemplary hardware block diagram of the power supply 200, and FIG. 3B is an exemplary hardware block diagram of the sensor signal processing part 300. The example of FIG. 3 is a set of diagrams showing a configuration for understanding of the present invention, and the sensor device 1 may include various other configurations of the power supply 200 and the sensor signal processing part 300 which are known or will be known.

Briefly referring to the power supply 200 and the sensor signal processing part 300 through FIG. 3, the power supply 200 includes an adaptive matching network 210, at least one rectifier 250, and at least one direct current (DC)-to-DC converter 290. The adaptive matching network 210 is configured to optimally match at least one of an RF signal, a resonant signal, a solar heat signal, and/or an electrostatic signal to a received power control signal. The CNN control part 100 may output a power control signal for matching the adaptive matching network 210 to one specific power source.

The rectifier 250 is connected to the adaptive matching network 210 and generates DC power from a signal of the adaptive matching network 210. The rectifier 250 may be, for example, a full bridge rectifier or half bridge rectifier. The at least one rectifier 250 operates according to the power control signal received from the CNN control part 100 to generate and output DC power.

The DC-to-DC converter 290 is connected to the rectifier 250 to boost or reduce the DC power of the rectifier 250 according to a set voltage. The DC-to-DC converter 290 may be, for example, a buck-boost converter. The DC-to-DC converter 290 may operate according to the power control signal received from the CNN control part 100 to output DC power of a set level.

The power control signal received from the CNN control part 100 is a signal for controlling the adaptive matching network 210, the at least one rectifier 250, and at least one DC-to-DC converter 290 by executing the CNN artificial intelligence algorithm on workload data (current amount data) of the DC power output from the power supply 200. The CNN control part 100 generates a power control signal for optimally controlling the power supply 200 with respect to the currently input workload data (by additionally using sensing data) and outputs the power control signal.

The sensor signal processing part 300 includes a first multiplexer (MUX) 310, a transimpedance amplifier (TIA) 320, a low noise amplifier (LNA) 330, a second MUX 350, a variable gain amplifier (VGA) 370, and a sensor device (SD) analog-to-digital converter (ADC) 390. The first MUX 310 outputs a signal of one of a plurality of sensor signal lines according to an applied selection signal. The first MUX 310 may output a signal of a sensor signal line of one pin among, for example, four pins that are connectable to the sensor 30 of the integrated circuit which is the signal processing circuit 10 according to a signal applied to a pin of the selection signal.

The TIA 320 is connected to the first MUX 310 to amplify the signal of the first MUX 310 and output the amplified signal. The TIA 320 amplifies the input signal according to a gain control signal received from the CNN control part 100 and outputs the amplified signal. For example, the TIA 320 may convert, for example, a current signal into a voltage signal, amplify the converted voltage signal according to the applied gain control signal, and output the amplified voltage signal.

The LNA 330 is connected to the first MUX 310 to amplify the signal of the first MUX 310 and output the amplified signal. The LNA 330 may amplify an input voltage signal according to the gain control signal received from the CNN control part 100 and output the amplified voltage signal.

The second MUX 350 is connected to the TIA 320 and the LNA 330 to selectively output the amplified signal of the TIA 320 or the amplified signal of the LNA 330. The second MUX 350 may output one signal according to the same selection signal as the pin of the selection signal of the first MUX 310 or output one signal according to a selection signal received from the CNN control part 100.

The VGA 370 is connected to the second MUX 350 to amplify the signal of the second MUX 250 according to the gain control signal.

The SD ADC 390 is connected to the VGA 370 to convert the analog signal of the VGA 370 into a digital signal and output converted sensing data. The SD ADC 390 may be a successive-approximation ADC including successive approximation register (SAR) logic, a capacitive digital-to-analog converter (CDAC), and a comparator.

The SD ADC 390 has a maximum resolution of 8 bits, 16 bits, or 32 bits and outputs the digital sensing data which is converted within the maximum resolution. The SD ADC 390 receives an enable signal for specifying the number of bits that are enabled within the maximum resolution from the analog PIM module 1000 or the CNN control part 100 and outputs digital sensing data having an output resolution corresponding to the number of bits enabled within the maximum resolution according to the enable signal.

For example, when the maximum bit resolution of the SD ADC 390 is 16 bits and the SD ADC 390 receives an 8-bit enable signal, the digital sensing data is scaled to 8 bits and output. When an enable signal for requesting a resolution increase to 10 bits is received while 8-bit sensing data is output, the SD ADC 390 may control the CDAC to generate and output 10-bit sensing data.

The gain control signal received from the CNN control part 100 is generated by executing the CNN artificial intelligence algorithm on the sensing data output from the sensor signal processing part 300. The CNN control part 100 may generate the gain control signal for controlling gain of the TIA 320, the LNA 330, and/or the VGA 370 using not only the sensing data output from the sensor signal processing part 300 but also the workload data and output the gain control signal.

Figure 4:
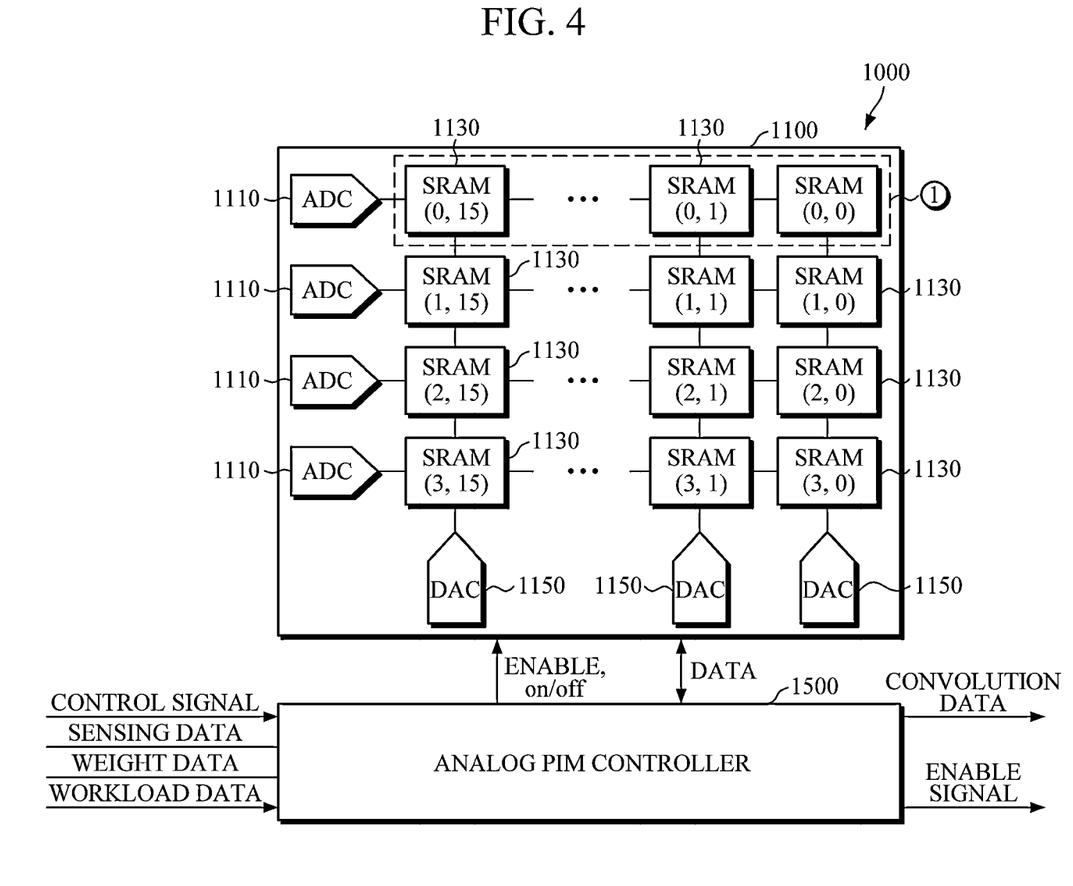
FIG. 4 is a block diagram illustrating a configuration of an analog passive intermodulation (PIM) module.
Figure 5:
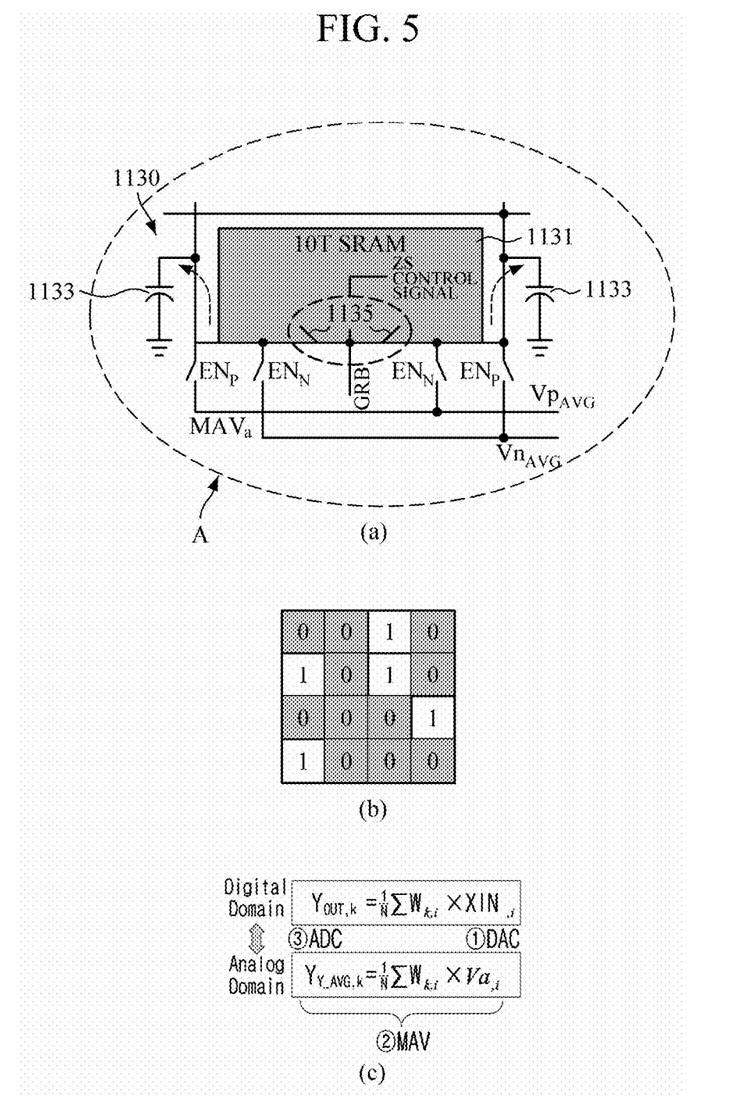
FIG. 5 is a set of diagrams illustrating an internal structure and operation of analog PIM.

FIG. 4 is a block diagram illustrating a configuration of the analog PIM module 1000, and FIG. 5 is a set of diagrams illustrating an internal structure and operation of analog PIM.

According to the present invention, the analog PIM module 1000 of FIG. 4 is configured to perform a convolution operation in an analog signal domain and dynamically adjust (increase or reduce) the resolution of the convolution operation. Due to the analog PIM module 1000 which may adjust a calculation resolution in a scalable way, it is possible to dynamically apply an optimal convolution operation and an optimal CNN algorithm for the optimal convolution operation to the signal processing circuit 10 regardless of the type of the sensor 30.

Further, the signal processing circuit 10 can reduce power consumption and increase calculation speed by adjusting a calculation resolution for an optimal convolution operation. The analog PIM module 1000 of FIG. 4 may be configured as an analog PIM circuit and is preferably included in the integrated circuit.

According to FIG. 4, the analog PIM module 1000 includes the analog PIM 1100 and an analog PIM controller 1500. The analog PIM module 1000 of FIG. 4 is preferably included in the signal processing circuit 10 of the sensor device 1 which is the integrated circuit.

The analog PIM 1100 is configured to perform a convolution operation between a weight matrix (e.g., 8 8, 4 4, 3 3, 2 2, 1 1, etc.) which is scaled to a variable size in the analog signal domain and an input data matrix (e.g., 8 8, 4 4, 3 3, 2 2, 1 1, etc.).

The analog PIM 1100 includes a plurality of (e.g., 8, 16, 64, etc., hereinafter, a "first plural number of") SRAM calculators 1130. The first plural number of SRAM calculators 1130 connected to each other (in a row, see ① in FIG. 4) perform a convolution operation using internal SRAMs 1131 and capacitors 1133 in the analog domain and generate an analog convolution result signal according to the convolution operation.

Among the first plural number of SRAM calculators 1130, a number (e.g., 1, 4, 8, 16, etc., hereinafter, a "second number") of enabled SRAM calculators 1130 perform a convolution operation according to control of the analog PIM controller 1500, and other disabled SRAM calculators 1130 stop the analog convolution operation. A disable signal may stop power supply to the SRAM calculators 1130 or open the capacitors 1133 of the SRAM calculators 1130 such that the convolution operation may be stopped.

Each of the first plural number of SRAM calculators 1130 (temporarily) stores one weight (a weight of 1 or 0) of a weight matrix in the SRAM 1131 and stores one piece of input data of an input data matrix as an analog signal in the capacitor 1133. Each SRAM calculator 1130 performs a product operation between the weight of the SRAM 1131 and the stored input data of the capacitor 1133 in the analog domain, and the first plural number of SRAM calculators 1130 perform an average operation on the product operations using (the total capacity of) the provided capacitors 1133 to generate a convolution result signal.

The analog PIM 1100 further includes the first plural number of digital-to-analog converters (DACs) 1150. Each of the first plural number of DACs 1150 is connected to the first plural number of SRAM calculators 1130 to convert digital input data (e.g., workload data and sensing data) into analog input data and output the analog input data to the SRAM calculators 1130.

Each of the first plural number of SRAM calculators 1130 (of one row in FIG. 4) connected to each other according to the present invention includes an SRAM 1131 and at least one (preferably two) capacitor(s) 1133 therein and includes at least one skip switch 1135 that controls storage of analog input data in the at least one capacitor 1133 through the DAC 1150 (see the structure of the SRAM calculator 1130 in FIG. 5A).

The SRAM 1131 including 10 transistors and the like stores a weight having a binary signal of 1 or 0, and the capacitor 1133 stores analog input data through the connected DAC 1150. The skip switch 1135 may store the analog input data in the capacitor 1133 of the SRAM calculator 1130 when an on-control signal (a zero skip (ZS) control signal) is received from the analog PIM controller 1500 and may not store the analog input data in the capacitor 1133 of the SRAM calculator 1130 when an off-control signal is received.

Also, the analog PIM 1100 further includes at least one ADC 1110. When the analog PIM module 1000 includes the first plural number of SRAM calculators 1130 in L rows (L is an integer equal to or greater than one, for example, four as shown in FIG. 4), the analog PIM 1100 may have L (e.g., 4) ADCs 1110.

Each of the ADCs 1110 is connected to a first plural number of SRAM calculators 1130 in one specific row to convert an analog convolution result signal output from the first plural number of SRAM calculators 1130 into digital convolution data and output the converted digital convolution data.

The analog PIM controller 1500 of the analog PIM module 1000 controls the analog PIM 1100 to perform a convolution operation in the analog domain. The analog PIM controller 1500 includes gates of a logic circuit (e.g., a circuit generated according to register transfer level (RTL) code) and controls the analog PIM 1100 according to a control signal received from the CNN control part 100 to control performing of the convolution operation.

The analog PIM controller 1500 is preferably configured to control a second number of enabled SRAM calculators 1130 among a first plural number of SRAM calculators 1130 so that a convolution operation may be performed in the analog domain.

The analog PIM controller 1500 stores a weight in the SRAMs 1131 of the second number of enabled SRAM calculators 1130 among the first plural number of SRAM calculators 1130 and stores input data in the capacitors 1133. The analog PIM controller 1500 stores the weight and input data through the DACs 1150 connected to the second number of SRAM calculators 1130. When a value of the weight stored in the weight storage process is a specified value (e.g., logic (a bit of) 0), the analog PIM controller 1500 outputs an off-control signal for opening the skip switches 1135 to the SRAM calculators 1130.

The analog PIM controller 1500 omits performing of an analog operation (a product operation) at the SRAM calculators 1130 by outputting the off-control signal to the SRAM calculators 1130. When the stored weight is another value (e.g., logic (a bit of) 1), the analog PIM controller 1500 outputs an on-control signal for turning on (connecting) the skip switches 1135 to the SRAM calculators 1130.

When the weight is 0, performing an analog product operation at the SRAM calculators 1130 is omitted by controlling the skip switches 1135 further included in the SRAM calculators 1130. Accordingly, it is possible to reduce the power consumption of the analog PIM 1100 and increase the speed of a convolution operation.

FIG. 5B shows an example of a weight matrix having a 4 4 size (of which a second number is 16). As shown in the example of FIG. 5B, when a weight of (elements of) a specific row and column of a weight matrix is 0, the skip switches 1135 of the corresponding SRAM calculators 1130 are turned off (opened), and thus the corresponding SRAM calculators 1130 omit a product operation.

On the basis of convolution data output from the ADC 1110, the analog PIM controller 1500 outputs an enable control signal for enabling a second number (which is equal to or greater than 1 and equal to or less than the first plural number) of SRAM calculators 1130 among the first plural number of SRAM calculators 1130 to the first plural number of SRAM calculators 1130.

The analog PIM controller 1500 outputs enable signals for activating the second number of SRAM calculators 1130 among the first plural number of SRAM calculators 1130 to the second number of SRAM calculators 1130 and outputs disable signals for deactivating other SRAM calculators 1130 among the first plural number of SRAM calculators 1130 to the other SRAM calculators 1130.

Each of the disable signals stops an analog operation (a product operation) at each of the other SRAM calculators 1130. For example, the disable signal blocks power supplied to the SRAM calculator 1130 or open the capacitor 1133, which is connected to the ground, through a switch additionally provided in a read/write line (see FIG. 5A).

FIG. 5C shows exemplary equations and a process of a convolution operation performed by the analog PIM 1100 through a conversion from the digital domain to the analog domain. Input data (workload data and/or sensor data) and a weight are converted into analog input data and a weight through the DAC 1150 and stored (see ① of FIG. 5C) in the second number (e.g., 16) of SRAM calculators 1130 among the first plural number of SRAM calculators 1130.

Each of the second number (e.g., 16) of SRAM calculators 1130 among the first plural number of SRAM calculators 1130 performs a product operation between the SRAM 1131 and the capacitor 1133. Then, signals based on capacitance of all the capacitors 1133 between the second number (e.g., 16) of SRAM calculators 1130 are averaged to generate an analog convolution result signal (see ② of FIG. 5C). The ADC 1110 connected to the second number of enabled SRAM calculators 1130 converts (see ③ of FIG. 5C) digital convolution data according to the size of the convolution result signal (e.g., a voltage signal level).

The converted digital convolution data is output to the CNN controller 2000 of the CNN control part 100, and the CNN controller 2000 may extract and classify characteristics according to the CNN artificial intelligence algorithm.

The analog PIM controller 1500 is preferably configured to dynamically change the resolution of data used in a convolution operation and the operation. The analog PIM controller 1500 is preferably configured to adjust the resolution of input data output from the SD ADC 390 and/or the resolution (the second number of SRAM calculators 1130) of an analog convolution operation on the basis of the input data output from the SD ADC 390 connected to the analog PIM module 1000 and/or convolution data output from the ADCs 1110 of the analog PIM 1100.

For example, when the input data output from the SD ADC 390 of the sensor signal processing part 300 connected to the analog PIM module 1000 does not change a set number of times or more, the analog PIM controller 1500 increases the output resolution of the SD ADC 390 and determines the second number of new SRAM calculators 1130, which will be enabled among the first plural number of SRAM calculators 1130 after the output resolution of the SD ADC 390 is increased, according to convolution data output from the ADCs 1110.

In addition, the analog PIM controller 1500 interfaces with the analog PIM 1100 to output sensing data of the sensor signal processing part 300 or workload data of the power supply to the DACs 1150 connected to the second number of SRAM calculators 1130 selected by the input data and output a weight of the CNN controller 2000 to the DACs 1150 connected to the second number of SRAM calculators 1130. Also, the analog PIM controller 1500 may output convolution data output through the ADCs 1110 to the CNN controller 2000.

The analog PIM controller 1500 (or the CNN controller 2000) samples input data at sampling periods according to the determined second number (and upon an event), to store the sampled input data in the analog PIM 1100 and then allows an analog convolution operation. Like this, the analog PIM controller 1500 outputs input data which is adjusted according to the second number changed through a determination to the changed second number of SRAM calculators 1130. Also, the analog PIM controller 1500 receives weight data which is adjusted according to the changed second number from the CNN controller 2000 and outputs an adjusted weight to the second number of SRAM calculators 1130.

Figure 6:
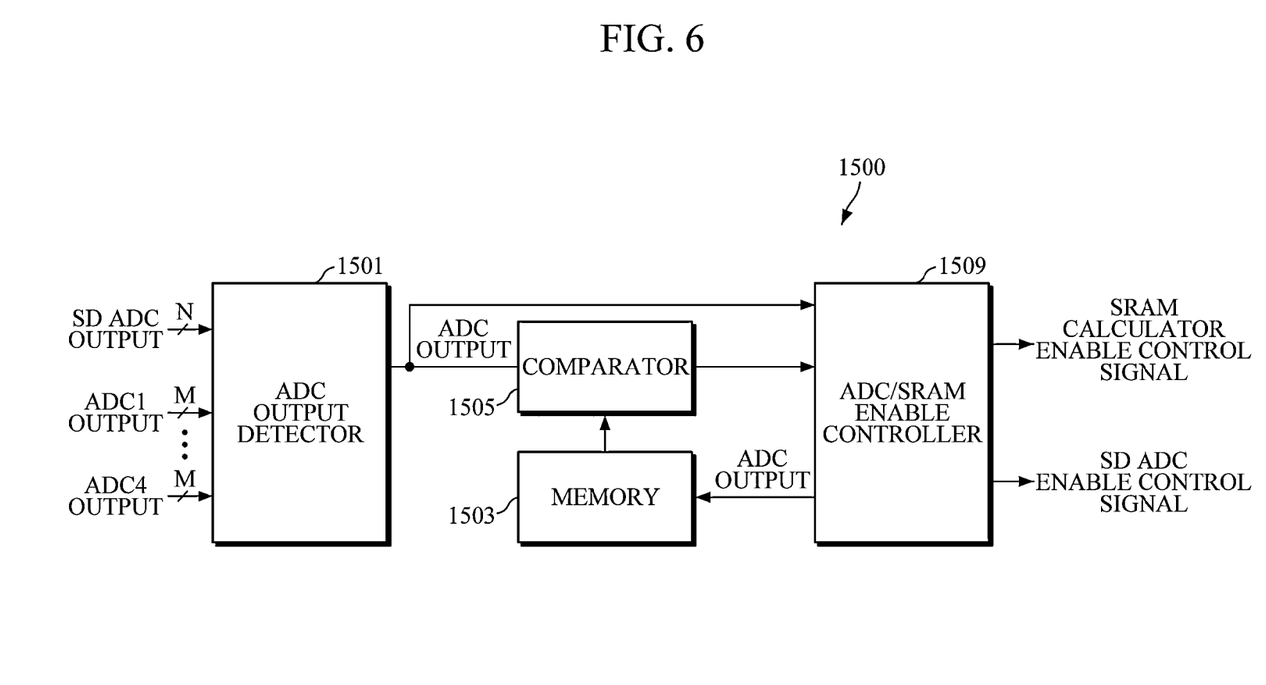
FIG. 6 is an exemplary block diagram of an analog PIM controller.

FIG. 6 is an exemplary block diagram of the analog PIM controller 1500.

According to FIG. 6, the analog PIM controller 1500 includes an ADC output detector 1501, a comparator 1505, a memory 1503, and an ADC/SRAM enable controller 1509. The analog PIM controller 1500 of FIG. 6 is configured as a logic circuit (e.g., a circuit generated according to RTL code) and implemented as an integrated circuit through a plurality of gates.

The ADC output detector 1501 detects convolution data output from the ADCs 1110 of the analog PIM 1100 and also detects input data (sensing data) output from the SD ADC 390 of the sensor signal processing part 300 connected to the analog PIM module 1000. When a signal representing a data output is received from the CNN controller 2000, other control logic of the analog PIM controller 1500, and/or the sensor signal processing part 300, the ADC output detector 1501 may detect data. The ADC output detector 1501 outputs the detected data (convolution data or input data).

The memory 1503 stores previous input data and previous convolution data which are output to the ADC output detector 1501.

The comparator 1505 digitally compares the convolution data output from the ADC output detector 1501 with the convolution data which is previously (immediately previously) output and outputs a comparison result signal. Also, the comparator 1505 digitally compares the input data output from the ADC output detector 1501 with the input data which is previously (immediately previously) detected and output and outputs a comparison result signal.

As a result of the comparison between data of the memory 1503 and the data output from the ADC output detector 1501, the comparator 1505 outputs a comparison result signal representing whether the data of the memory 1503 is the same as the data output from the ADC output detector 1501 with respect to each of convolution data and input data.

The ADC/SRAM enable controller 1509 determines the second number of SRAM calculators 1130 to be used in an analog convolution operation and the number of bits of the SD ADC 390 according to the comparison results of the comparator 1505. According to a result of the comparison between current data (input data and convolution data) and previous data, the ADC/SRAM enable controller 1509 generates and outputs an enable (control) signal to the SD ADC 390 to increase the resolution of the SD ADC 390 and generates and outputs an enable (control) signal to the second plural number of SRAM calculators 1130 of the analog PIM 1100 to increase the resolution of the convolution operation.

For example, when the ADC/SRAM enable controller 1509 consecutively receives the same comparison result signal for convolution data from the comparator 1505 a set number of times (e.g., four times, five times, etc.), the ADC/SRAM enable controller 1509 determines a second number greater than the currently set second number to increase the resolution of an analog operation of the first plural number of SRAM calculators 1130. For example, when four SRAM calculators 1130 are currently used among the total of 64 SRAM calculators 1130, the ADC/SRAM enable controller 1509 increases the second number from four to five (or eight, nine, etc.). The set number of times may be set by the control terminal 2. The ADC/SRAM enable controller 1509 outputs an enable control signal for enabling the increased second number of SRAM calculators 1130 to the first plural number of SRAM calculators 1130. The ADC/SRAM enable controller 1509 outputs enable signals for enabling the increased second number of SRAM calculators 1130 among the first plural number of SRAM calculators 1130 to the second number of SRAM calculators 1130 and outputs disable signals for disabling other SRAM calculators 1130 to the other SRAM calculators 1130.

In this process, when an output resolution of a convolution operation for input data is low, the analog PIM module 1000 can perform a convolution operation fit for the sensor 30 or optimized for a state of the sensor 30 while reducing power consumption by increasing the resolution of an analog operation in real time.

Also, the ADC/SRAM enable controller 1509 increases the output resolution of the SD ADC 390 according to a comparison result acquired for input data through the comparator 1505. When the ADC/SRAM enable controller 1509 consecutively receives the same comparison result signal for input data a set number of times (e.g., four times, five times, etc.), the ADC/SRAM enable controller 1509 outputs an enable control signal to the SD ADC 390 so that the SD ADC 390 may have a resolution higher than a currently set output resolution. The ADC/SRAM enable controller 1509 outputs an SD ADC enable control signal for enabling a larger number of bits (e.g., increased by 1 bit) than a currently set number of bits of the SD ADC 390. The set number of times may be set by the control terminal 2, and the set number of times used for input data may differ from the set number of times used for convolution data.

When the enable control signal is received, the SD ADC 390 controls the CDAC and the like therein to output digital sensing data having the resolution of the increased number of bits.

Following the increase in the number of output bits of the SD ADC 390, the ADC/SRAM enable controller 1509 redetermines the second number of SRAM calculators 1130 to be enabled among the first plural number of SRAM calculators 1130 using convolution data output through the ADCs 1110 of the analog PIM 1100. When the same comparison result signal is consecutively received with respect to convolution data through the comparator 1505 the set number of times or more (e.g., four times, five times, etc.) beginning with the minimum number (e.g., 1) of the first plural number, the ADC/SRAM enable controller 1509 determines a second number greater than the currently set second number to increase the resolution of an analog operation of the first plural number of SRAM calculators 1130.

The ADC/SRAM enable controller 1509 performs the second number of determination processes repeatedly or simultaneously (in parallel) to detect an optimal resolution of a convolution operation with the changed output resolution of the SD ADC 390 and accordingly allows execution of the CNN artificial intelligence algorithm optimized for the connected sensor 30 or a state of the sensor 30. The ADC/SRAM enable controller 1509 outputs an enable control signal for enabling the second number of SRAM calculators 1130 to the first plural number of SRAM calculators 1130 and also outputs an enable control signal for activating the second number of DACs 1150 connected to the second number of SRAM calculators 1130. Also, the ADC/SRAM enable controller 1509 may output a disable signal to other DACs 1150 among the first plural number of DACs 1150 to deactivate the other DACs 1150.

A resolution determination process performed by the ADC/SRAM enable controller 1509 will be further described with reference to FIG. 7.

Figure 7:
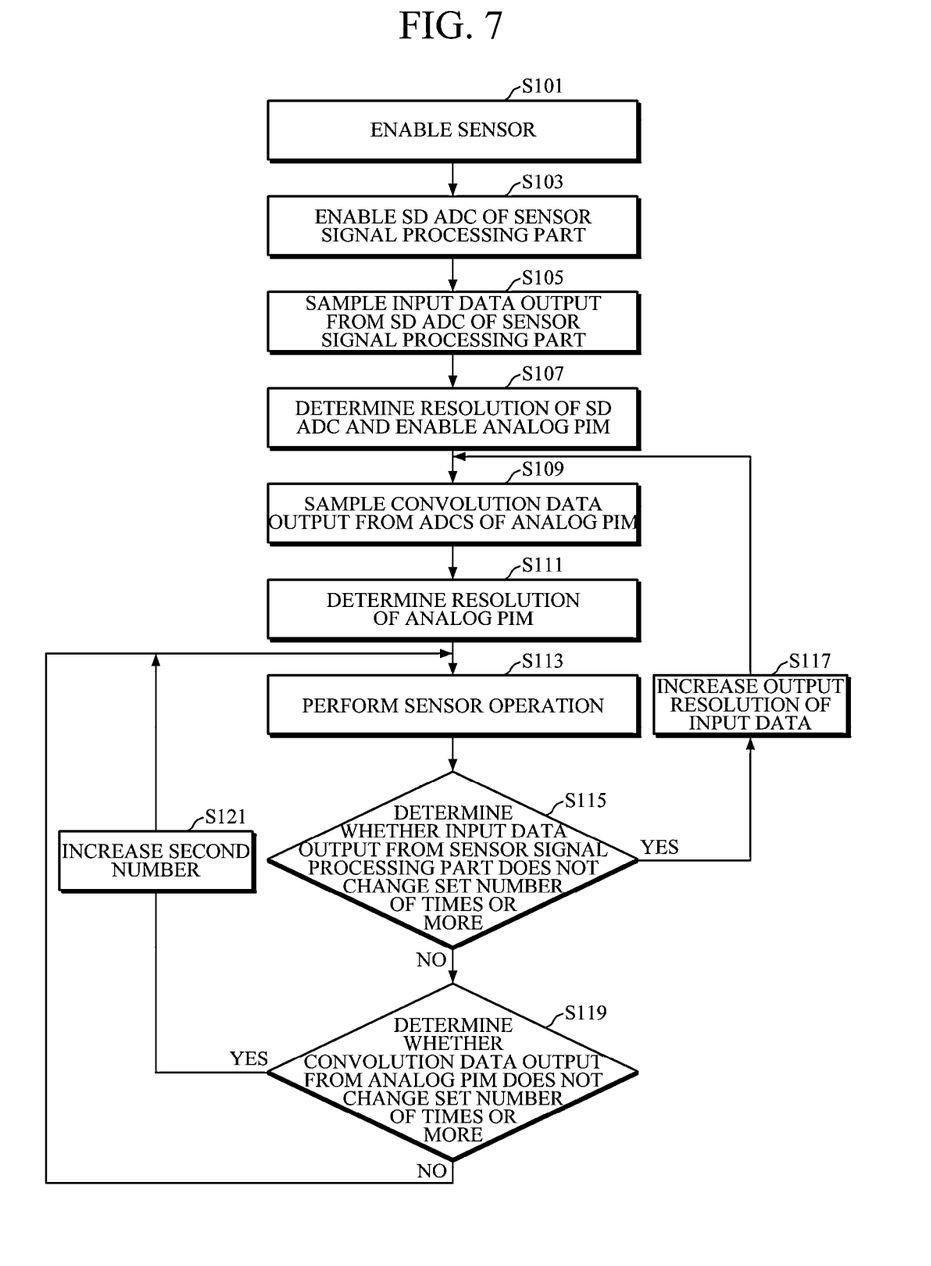
FIG. 7 is a flowchart illustrating an exemplary control flow for determining an output and calculation resolution fit for an arbitrary sensor.

FIG. 7 is a flowchart illustrating an exemplary control flow for determining an output and calculation resolution fit for an arbitrary sensor 30.

The control flow of FIG. 7 for controlling the analog PIM 1100 is performed by the signal processing circuit 10 and preferably performed by (the analog PIM controller 1500 of) the analog PIM module 1000 according to control of the CNN control part 100. Since the signal processing circuit 10 has been described in detail above with reference to FIGS. 1 to 6, the control flow will be mainly described below.

First, the signal processing circuit 10 enables the sensor 30 (S101). The signal processing circuit 10 may start or initialize operation of the sensor 30 by supplying power to the sensor 30 according to a power on reset (POR) signal which is applied from the outside or generated with power supply. The signal processing circuit 10 also initializes the internal circuits 100, 200, and 300.

Subsequently, the signal processing circuit 10 enables the SD ADC 390 of the sensor signal processing part 300 (S103). For example, the signal processing circuit 10 enables the SD ADC 390 to have output resolutions of all numbers of bits.

The signal processing circuit 10 samples input data (sensing data) output from the SD ADC 390 of the sensor signal processing part 300 (S105) and determines the resolution of the SD ADC 390 from the sampled input data (S107).

The signal processing circuit 10 samples the input data a plurality of times and determines the number of bits that change less than a set number of times among a minimum number of bits (e.g., one bit) of the SD ADC 390 to a maximum number of bits (e.g., 16 bits, 32 bits, etc., a maximum number of resolution bits which may be output by the SD ADC 390) as an initial resolution of the SD ADC 390 using the comparator 1505. The signal processing circuit 10 may determine the initial resolution by sequentially processing the numbers of bits or making a decision for every number of bits in parallel.

The signal processing circuit 10 outputs an enable control signal for enabling the number of bits which are determined according to the initial resolution to the SD ADC 390, and the SD ADC 390 outputs digital sensing data according to the set resolution.

Following the determination of the first (initial) resolution, the signal processing circuit 10 enables the analog PIM 1100 (S107). The CNN controller 2000 may control the analog PIM controller 1500 to initialize the analog PIM 1100.

After the analog PIM 1100 is enabled, the signal processing circuit 10 samples convolution data output from the ADCs 1110 of the analog PIM 1100 (S109) and determines the resolution of the analog PIM 1100 from the sampled convolution data (S111). The signal processing circuit 10 performs a convolution data comparison test sequentially from the minimum resolution (a case where the second number is one) of the analog PIM 1100 to the maximum resolution (a case where the second number is the first plural number) according to control of the CNN controller 2000 and determines the initial calculation resolution of the analog PIM 1100 according to the comparison test results. The signal processing circuit 10 may perform a convolution operation on a weight and the input data (sensing data) at a currently set resolution among the minimum resolution to the maximum resolution. When digital convolution data which is a convolution operation result does not change the set number of times or more, the signal processing circuit 10 may increase the currently set resolution and repeatedly compare current convolution data with previous convolution data at the increased resolution to determine an optimal initial calculation resolution. Through this test process, the signal processing circuit 10 determines an initial second number.

After the number of bits of the SD ADC 390 and the second number are determined according to the initialization process (S101 to S111), the signal processing circuit 10 dynamically adjusts the number of bits of the SD ADC 390 and the second number according to an output of the SD ADC 390 or the ADCs 1110 of the analog PIM 1100 to maintain an optimal resolution required for a convolution operation and optimize power consumption in real time.

More specifically, after the number of bits of the SD ADC 390 and the second number are determined (S101 to S111), the signal processing circuit 10 performs a sensor operation according to control of the CNN control part 100 (S113).

The signal processing circuit 10 generates an analog convolution result signal through the second number, which is equal to or greater than one, of enabled SRAM calculators 1130 among the first plural number of SRAM calculators 1130 in the analog PIM 1100 according to an analog operation between the weight and input data (e.g., sensing data) and converts a convolution result signal generated through the ADCs 1110 of the analog PIM 1100 into digital convolution data. The signal processing circuit 10 may perform a CNN artificial intelligence algorithm in real time using the converted convolution data.

The process of generating the convolution result signal is configured to omit an analog operation (a product operation) through the skip switches 1135 in the second number, which is equal to or greater than one, of SRAM calculators 1130 according to an off-control signal that is received from the analog PIM controller 1500 and set according to the weight value.

Following the sensor operation, the signal processing circuit 10 determines whether digital input data output from the sensor signal processing part 300 does not change the set number of times or more (S115). When the digital input data does not change the set number of times or more, the signal processing circuit 10 determines that the output resolution of the sensor signal processing part 300 is low and increases the output resolution of the input data (S117).

The signal processing circuit 10 increases a currently set number of output bits of the SD ADC 390 by one or more and outputs an enable control signal representing the increased number of bits to the SD ADC 390.

Following the increase in the output resolution of the input data (with the increase in the number of bits of the SD ADC 390), the signal processing circuit 10 performs operations S109 and S111 again. In other words, the signal processing circuit 10 sequentially increases the second number of SRAM calculators 1130 to be enabled among the first plural number of SRAM calculators 1130 between a minimum number and the first plural number and redetermines the second number through a comparison between convolution data output from the increased second number of SRAM calculators 1130 and the same second number of pieces of previous convolution data. Through this process, when the number of output bits of the SD ADC 390 is changed, an optimal resolution of an analog calculation is dynamically calculated such that performing of the CNN artificial intelligence algorithm is optimized.

Also, the signal processing circuit 10 dynamically determines the second number of SRAM calculators 1130 to be enabled among the first plural number of SRAM calculators 1130 on the basis of convolution data output from the analog PIM 1100 (S119 and S121). When the convolution data output from the analog PIM 1100 is (consecutively) the same as previous convolution data the set number of times or more (S119), the signal processing circuit 10 increases the second number to increase a calculation resolution of the first plural number of SRAM calculators 1130 (S121).

The signal processing circuit 10 determines a second number greater than the currently determined second number, enables (the DACs 1150 corresponding to) the determined second number of SRAM calculators 1130, and performs a subsequent sensor operation accordingly. The signal processing circuit 10 outputs an enable control signal for enabling (the DACs 1150 corresponding to) the changed second number of SRAM calculators 1130 to (the DACs 1150 corresponding to) the first plural number of SRAM calculators 1130 and outputs a convolution result of the adjusted calculation resolution through the activated SRAM calculators 1130 and DACs 1150.

According to the above control flow, the signal processing circuit 10 can process the sensor 30 in combination with the sensor 30 for universal use regardless of the type of the sensor 30 and can dynamically process an efficient convolution operation and have optimized power consumption according to a type or state of the sensor 30.

The above-described scalable analog PIM module, analog PIM control method, signal processing circuit, and sensor device according to the present invention are free from restrictions on the installation environment, can determine the state of a sensor using artificial intelligence technology, and can be applied to various types of sensors for universal use.

Also, the above-described scalable analog PIM module, analog PIM control method, signal processing circuit, and sensor device according to the present invention are applicable to various types of sensors and can efficiently reduce power consumption by dynamically changing the computational structure of an analog PIM module at an optimal resolution according to input data of an employed sensor.

Further, the above-described scalable analog PIM module, analog PIM control method, signal processing circuit, and sensor device according to the present invention can relieve the bottleneck of an existing high-speed data processing system by applying scalable PIM to the CNN computation of artificial intelligence technology, select and supply optimal energy according to an external situation, and support various types of sensors.

Effects that can be achieved from the present invention are not limited to those described above, and other effects which have not been described above can be clearly understood by those of ordinary skill in the art from the above descriptions. Since various substitutions, modifications, and alterations can be made by those of ordinary skill in the art without departing from the technical scope of the present invention, the present invention described above is not limited to the above-described embodiments and the accompanying drawings.

What is claimed is:

1. A scalable analog passive intermodulation (PIM) module comprising:
   a first plural number of digital-to-analog converters (DACs);
   a first plural number of static random access memory (SRAM) calculators connected to the first plural number of DACs, among which a second number, which is one or more, of enabled SRAM calculators generate an analog convolution result signal through an analog operation between a weight and input data;
   at least one analog-to-digital converter (ADC) connected to the first plural number of SRAM calculators and configured to convert the analog convolution result signal into digital convolution data; and
   an analog PIM controller configured to output an enable control signal for enabling the second number, which is equal to or less than first plural number, of SRAM calculators among the first plural number of SRAM calculators to the first plural number of SRAM calculators on the basis of the convolution data output from the ADC.

2. The scalable analog PIM module of claim 1, wherein the analog PIM controller outputs an enable signal for activating the second number of SRAM calculators among the first plural number of SRAM calculators to the second number of SRAM calculators and outputs a disable signal for deactivating other SRAM calculators among the first plural number of SRAM calculators to the other SRAM calculators, and
   the disable signal stops the analog operation in the other SRAM calculators.

3. The scalable analog PIM module of claim 1, wherein each of the SRAM calculators comprises:
   an SRAM configured to store the weight;
   a capacitor configured to store the analog input data through the connected DAC; and
   a skip switch configured to control storage of the analog input data in the capacitor, and
   when a value of the weight stored in the SRAM calculator is a specified first value, the analog PIM controller outputs an off-control signal for opening the skip switch of the SRAM calculator to the SRAM calculator to omit the analog operation of the SRAM calculator.

4. The scalable analog PIM module of claim 1, wherein, when input data output from a sensor device (SD) ADC of a sensor signal processing part connected to the analog PIM module does not change a set number of times or more, the analog PIM controller increases an output resolution of the SD ADC and determines the second number of new SRAM calculators to be enabled among the first plural number of SRAM calculators according to the convolution data output from the ADC.

5. The scalable analog PIM module of claim 1, wherein the analog PIM controller comprises:
   an ADC output detector configured to detect the convolution data output from the ADC;
   a comparator configured to compare the convolution data from the ADC output detector with previous convolution data; and
   an ADC/SRAM enable controller configured to generate the enable control signal for enabling the second number of SRAM calculators determined from among the first plural number of SRAM calculators according to a comparison result of the comparator and output the enable control signal to the first plural number of SRAM calculators.

6. The scalable analog PIM module of claim 5, wherein the ADC output detector further detects input data output from a sensor device (SD) ADC of a sensor signal processing part connected to the analog PIM module,
   the comparator further compares the input data with previous input data, and
   the ADC/SRAM enable controller outputs the enable control signal to the SD ADC to increase an output resolution of the SD ADC according to a comparison result of the input data and redetermines the second number of SRAM calculators to be enabled among the first plural number of SRAM calculators using the convolution data output from the ADC after the enable control signal is output to the SD ADC.

7. The scalable analog PIM module of claim 6, wherein the analog PIM controller further comprises a memory configured to store the previous input data and previous convolution data.

8. The scalable analog PIM module of claim 5, wherein, when the same result signal is consecutively received from the comparator a specified number of times or more, the ADC/SRAM enable controller outputs the enable control signal for enabling a second number, which is larger than the currently set second number, of SRAM calculators to the first plural number of SRAM calculators to increase a resolution of the analog operation of the first plural number of SRAM calculators.

9. The scalable analog PIM module of claim 5, wherein the analog PIM controller outputs the weight and the input data adjusted according to a change of the second number based on the determination to the changed second number of SRAM calculators.

10. The scalable analog PIM module of claim 1, wherein the analog PIM module is included in an integrated circuit.

11. A signal processing circuit comprising:
    a power supply configured to generate power from an external signal;
    a sensor signal processing part configured to process a sensing signal of a sensor; and
    a convolutional neural network (CNN) control part configured to control the power supply and the sensor signal processing part according to workload data of the power generated by the power supply and sensing data generated by the sensor signal processing part,
    wherein the CNN control part includes the scalable analog passive intermodulation (PIM) module of claim 1.

12. The signal processing circuit of claim 11, wherein the CNN control part generates and outputs a power control signal for controlling the power supply and a gain control signal for controlling gain of the sensor signal processing part from the workload data and the sensing data according to a CNN artificial intelligence technology employing the scalable analog PIM module.

13. The signal processing circuit of claim 11, wherein the signal processing circuit is an integrated circuit.

14. A sensor device comprising:
the signal processing circuit of claim 11; and
a sensor connected to the signal processing circuit and configured to output a sensing signal to the signal processing circuit according to power supplied from the signal processing circuit.

15. A method of controlling analog passive intermodulation (PIM) comprising:
generating, by a second number, which is one or more, of enabled static random access memory (SRAM) calculators among a first plural number of SRAM calculators, an analog convolution result signal according to an analog operation between a weight and input data;
converting the analog convolution result signal into digital convolution data;
determining the second number of SRAM calculators to be enabled among the first plural number of SRAM calculators on the basis of the convolution data; and
enabling the determined second number of SRAM calculators.

16. The method of claim 15, wherein the SRAM calculators comprise:
an SRAM configured to store the weight;
a capacitor configured to store the analog input data, and
a skip switch configured to control storage of the analog input data in the capacitor,
wherein the generating of the convolution result signal comprises omitting the analog operation through the skip switch according to an off-control signal received from the second number, which is one or more, of SRAM calculators.

17. The method of claim 15, wherein the determining of the second number of SRAM calculators to be enabled comprises, when the convolution data is the same as previous convolution data a specified number of times or more, increasing the second number to increase a calculation resolution of the first plural number of SRAM calculators.

18. The method of claim 15, further comprising, before the determining of the second number of SRAM calculators to be enabled, increasing an output resolution of digital input data output from a sensor signal processing part when the input data output from the sensor signal processing part does not change a specified number of times or more.

19. The method of claim 18, further comprising, after the increasing of the output resolution of the input data, sequentially increasing the second number, which is between a minimum number and the first plural number, of SRAM calculators to be enabled among the first plural number of SRAM calculators and redetermining the second number through a comparison between convolution data output from the increased second number of SRAM calculators and the same second number of pieces of previous convolution data.

* * * * *